United States Patent
Chen

(10) Patent No.: US 7,694,726 B2
(45) Date of Patent: *Apr. 13, 2010

(54) HEAT DISSIPATION SYSTEM

(75) Inventor: Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 1136 days.

This patent is subject to a terminal disclaimer.

(21) Appl. No.: 11/325,153

(22) Filed: Jan. 4, 2006

(65) Prior Publication Data

US 2006/0151153 A1   Jul. 13, 2006

(30) Foreign Application Priority Data

Jan. 7, 2005   (CN) ...................... 2005 1 0032761

(51) Int. Cl.
*F28D 15/00* (2006.01)
*H05K 7/20* (2006.01)

(52) U.S. Cl. ............................. 165/104.26; 165/104.21

(58) Field of Classification Search ............ 165/104.26, 165/104.21, 104.33, 133, 134.1; 361/700; 257/715; 174/15.2
See application file for complete search history.

(56) References Cited

U.S. PATENT DOCUMENTS

| | | | | |
|---|---|---|---|---|
| 3,885,622 A * | 5/1975 | McLain | ............... | 165/179 |
| 5,042,567 A | 8/1991 | Kajimoto et al. | | |
| 5,079,087 A * | 1/1992 | Lever et al. | ............... | 428/329 |
| 6,432,320 B1 * | 8/2002 | Bonsignore et al. | ............ | 252/70 |
| 6,644,388 B1 * | 11/2003 | Kilmer et al. | ................ | 165/133 |
| 2004/0005736 A1 * | 1/2004 | Searls et al. | ................ | 438/122 |
| 2004/0037039 A1 * | 2/2004 | Shimura et al. | ............. | 361/700 |
| 2004/0047126 A1 * | 3/2004 | Shih-Tsung | ................. | 361/688 |
| 2004/0206941 A1 | 10/2004 | Gurin | | |
| 2005/0238810 A1 * | 10/2005 | Scaringe et al. | ........... | 427/249.1 |
| 2006/0005951 A1 * | 1/2006 | Yeh et al. | ................ | 165/104.26 |

FOREIGN PATENT DOCUMENTS

| | | |
|---|---|---|
| CN | 2458660 Y | 11/2001 |
| CN | 1350569 A | 5/2002 |
| CN | 2522409 Y | 11/2002 |
| CN | 1389703 A | 1/2003 |
| CN | 1472803 A | 2/2004 |
| CN | 1478593 A | 3/2004 |
| CN | 2656925 Y | 11/2004 |
| JP | 2000329495 A | * 11/2000 |
| JP | 2003042674 A | * 2/2003 |

* cited by examiner

*Primary Examiner*—Tho v Duong
(74) *Attorney, Agent, or Firm*—Clifford O. Chi

(57) ABSTRACT

A heat dissipation system includes a heat sink, a heat pipe, and a cooling assembly. The heat sink includes a substrate and a number of fins extending therefrom. The heat sink has a receiving portion. The heat pipe includes a shell, a wick, and a working fluid contained in the shell. The heat pipe has an evaporation section and a condensation section. The evaporation section is inserted into the receiving portion of the substrate while the condensation section is equipped with the cooling assembly. A hydrophilic layer is formed on the wick so that the capillarity of the wick is enhanced. The heat dissipation system has two mechanisms by which to dissipate heat from a heat-generating component, i.e., via the heat sink and the heat pipe. Therefore, an efficiency of heat dissipation of the heat dissipation system is improved.

17 Claims, 2 Drawing Sheets

HEAT DISSIPATION SYSTEM

CROSS-REFERENCE TO RELATED APPLICATION

This application is related to a copending U.S. patent application Ser. No. 11/141,094 filed on May 31, 2005, and entitled "HEAT PIPE WITH HYDROPHILIC LAYER AND/OR PROTECTIVE LAYER AND METHOD FOR MAKING SAME", with the same assignee. The disclosure of the above-identified application is incorporated herein by reference.

TECHNICAL FIELD

The present invention relates to heat dissipating devices and, more particularly, to a heat dissipation system having a heat pipe, which can efficiently dissipate heat from a heat-generating component.

DISCUSSION OF THE RELATED ART

At present, electronic and electrical components, such as central processing units (CPUs) and engines of vehicles, exist a general tendency towards faster operational speeds and greater functional capabilities. When a CPU or an engine operates at high speeds or a high capacity in a limited enclosure, its temperature may increase greatly. Thus, it is desirable to quickly dissipate heat generated by the CPU or the engine.

Numerous kinds of heat dissipation systems have been developed for cooling the electronic and electrical components, for example, heat sinks or heat pipes. Conventionally, a heat sink includes a substrate and a number of fins extending from a surface thereof A conventional heat pipe includes an evaporation section to take in heat and a condensation section for the dissipation of heat. Working fluid is contained in the heat pipe to transfer heat from the evaporation section to the condensation section by phase changes thereof.

The conventional heat pipe does not begin to work until the electronic and electrical components to be cooled have reached a threshold temperature high enough to evaporate the working fluid. In general, the threshold temperature is between 30° C. and 40° C. That is, the electronic and electrical components must operate at a temperature of at least 30° C. One solution to decrease the threshold temperature of the working fluid is to improve the vacuum inside the heat pipe. However, this solution commonly requires high rigidity materials for the heat pipe shell, which increase the cost of manufacturing the heat pipe. Further, even slight damage to the heat pipe may result in leakage of air into the heat pipe and an increase in the pressure in the heat pipe (i.e., a decreased degree of vacuum). If this happens, the heat pipe may fail to work altogether.

The heat pipe generally has a variety of other limitations, such as a capillary pumping rate limit, a nucleate boiling limit, and an entrainment limit, all of which constrain the ability of the heat pipe to cool the electronic and electrical components. When the first of any of these limitations is reached, the heat pipe cannot provide any further improvement in its operating capacity. Furthermore, a heat dissipation system in a form of a heat pipe has a limited dissipation area so that the heat conductive efficiency thereof is limited.

What is needed, therefore, is a heat dissipation system which has a combined heat sink and heat pipe and can thereby efficiently dissipate heat from a heat-generating component.

SUMMARY

In a preferred embodiment of the present invention, a heat dissipation system includes a heat sink, a heat pipe, and a cooling assembly. The heat sink includes a substrate and a number of fins extending from a surface thereof. The heat sink has a receiving portion. The heat pipe includes a shell, a wick, and a working fluid contained in the shell. The wick is formed on an inner surface of the shell. A hydrophilic layer is sequentially formed on the wick. The shell has two opposite end sections. One is inserted into the receiving portion of the substrate, while the other is equipped with the cooling assembly.

The shell includes an interior surface and an exterior surface. The interior surface and the exterior surface have a roughness of peak to valley in the approximate range from 0.1 to 10 microns. The wick includes materials made from a mixture of carbon fibers and carbon nanocapsules. The wick has an approximate thickness in the range from 0.1 to 0.5 microns. The working fluid includes a volatile liquid (e.g., water, acetone, alcohol) and a number of thermal conductive nano-particles admixed thereinto. The hydrophilic layer is made from nanomaterials selected from the group consisting of nanomaterials of titanium dioxide, zinc oxide, alumina, and any mixtures thereof. The hydrophilic layer has a thickness about in the range from 10 to 200 nanometers.

The heat pipe further includes at least one protective layer formed on an exterior surface of the shell. The protective layer is made from nanomaterials selected from the group consisting of carbon nanotubes, nano-sized copper particles, nano-sized aluminum particles, and nano-sized particles made of a copper-aluminum alloy. The protective layer has a thickness in the approximate range from 10 to 500 nanometers.

In addition, a thermal interface material is disposed on an underside of the substrate of the heat sink configured for improving heat contact area between the substrate and a heat-generating component.

The heat dissipation system has two passages to dissipate heat from a heat-generating component. One is the heat sink, while the other is the heat pipe. In the heat sink aspect, the fins provide a great heat dissipation area. The substrate can efficiently transfer heat to the fins as well as to the heat pipe.

In the heat pipe aspect, due to the hydrophilic layer formed on the wick of the heat pipe, the capillarity of the wick is enhanced. Thus, the working fluid is driven to flow from a condensation section of the heat pipe back to an evaporation section of the heat pipe more rapidly In addition, the protective layer on the exterior surface of the shell maintains the degree of vacuum within the heat pipe in a desired range and enhances heat flow from the substrate to the shell. Thus, the stability, working lifetime, and heat transfer capability of the heat pipe are improved by the presence of the shell. Furthermore, employing surface laser texturing treatment and vacuum coating technologies gives the heat pipe a more compact inner structure and promotes more efficient heat flow. Therefore, a thermal transfer efficiency of the heat dissipation system is improved.

Other advantages and novel features will become more apparent from the following detailed description of embodiments when taken in conjunction with the accompanying drawings.

BRIEF DESCRIPTION OF THE DRAWINGS

Many aspects of the heat dissipation system can be better understood with reference to the following drawings. The components in the drawings are not necessarily to scale, the emphasis instead being placed upon clearly illustrating the principles of the present heat dissipation system. Moreover, in the drawings, like reference numerals designate corresponding parts throughout the several views.

DETAILED DESCRIPTION OF THE EMBODIMENTS

Embodiments of the present heat dissipation system now be described in detail below with reference to the drawings.

Figure 1:
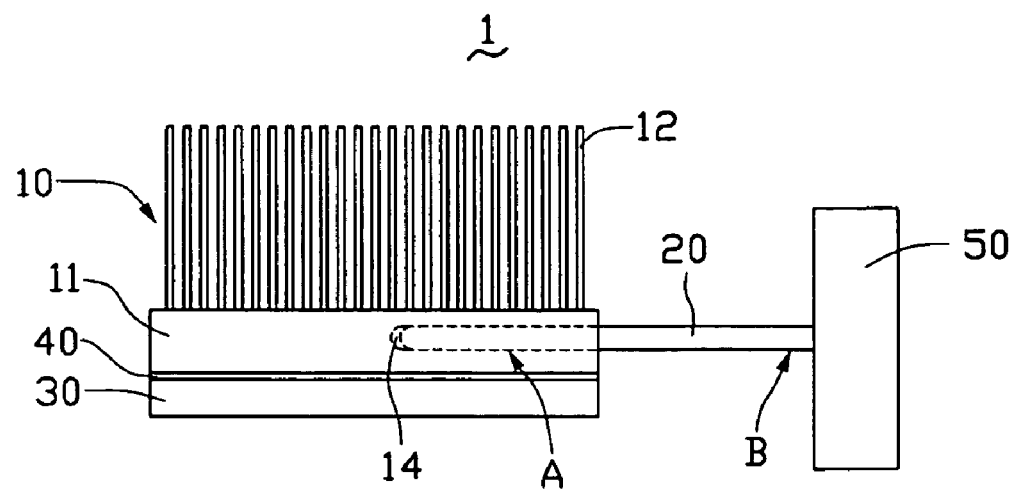
FIG. 1 is a simplified, schematic view of a heat dissipation system in according with a preferred embodiment.

FIG. 1 illustrates a heat dissipation system 1 in accordance with a preferred embodiment. The heat dissipation system 1 includes a heat sink 10, a heat pipe 20, and a cooling assembly 50. The heat sink 10 includes a substrate 11 and a number of fins 12 extending from a surface thereof. The heat pipe 20 generally has two opposite end sections, i.e., an evaporation section "A" and a condensation section "B". The substrate 11 has a receiving portion 14 for the insertion of the evaporation section "A" of the heat pipe 20 thereinto. The cooling assembly 50 is disposed adjacent the condensation section "B" of the heat pipe 20 and is configured for promoting heat transfer away from the heat pipe 20.

The substrate 11 and the fins 12 are advantageously made of a metal displaying excellent thermal conductivity and good oxidation resistance, preferably a material selected from the group consisting of aluminum, copper, and aluminum-copper alloy The cooling assembly 50 advantageously incorporates at least one of a fan and a number of fins. If the cooling assembly 50 includes a number of fins, such fins could be formed on the condensation section "B" of the heat pipe 20, instead.

The heat dissipation system 1 further includes a thermal interface material (hereinafter, TIM) 40. The TIM 40 is applied on an underside of the substrate 11, opposite to the surface carrying at least a substantial portion, if not essentially all, of the fins 12. The TIM 40 is particularly configured for improving heat conductive efficiency between the substrate 11 and a heat source 30. The TIM 40 is preferably a plurality of carbon nanotubes formed on the underside of the substrate 11 or a carbon nanotube-based TIM (i.e., a TIM containing, predominantly (e.g., ~70%+), carbon nanotubes). The carbon nanotubes formed on the underside of the substrate 11 are beneficially formed by, e.g., a chemical vapor deposition method, a plasma-enhanced chemical vapor deposition method, or a thermal-enhanced chemical vapor deposition method. The carbon nanotube-based TIM advantageously includes a matrix incorporating a plurality of carbon nanotubes thereinto. The matrix is advantageously comprised of a polymer matrix, e.g., silicone elastomer, polyester, epoxy resin, polyvinyl chloride, polyvinyl alcohol, polycarbonate resin, etc.

Figure 2:
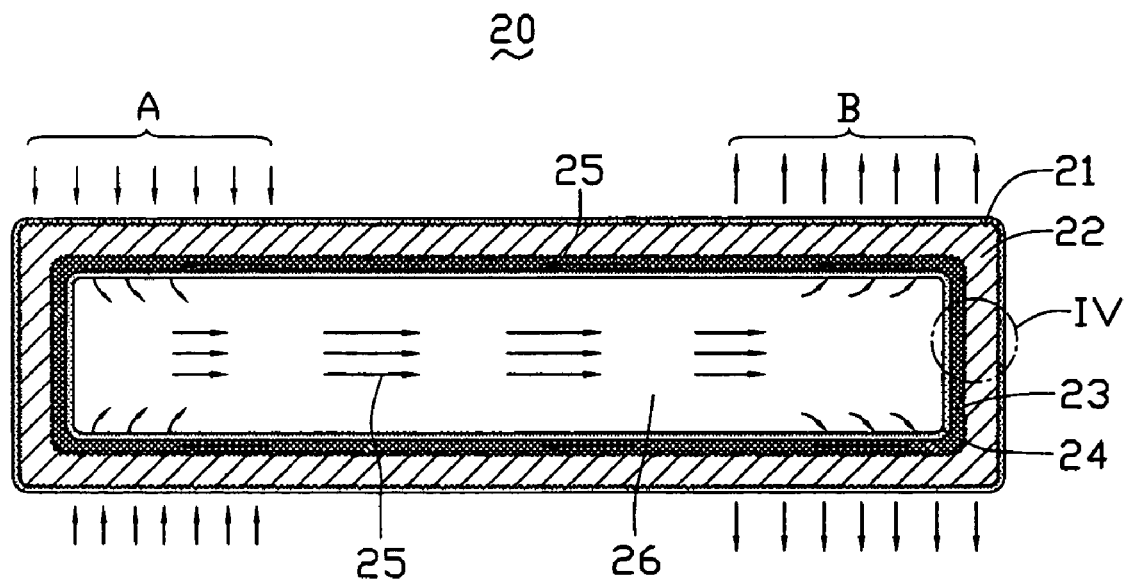
FIG. 2 is an axial cross-sectional view of a heat pipe used in the heat dissipation system of FIG. 1.
Figure 3:
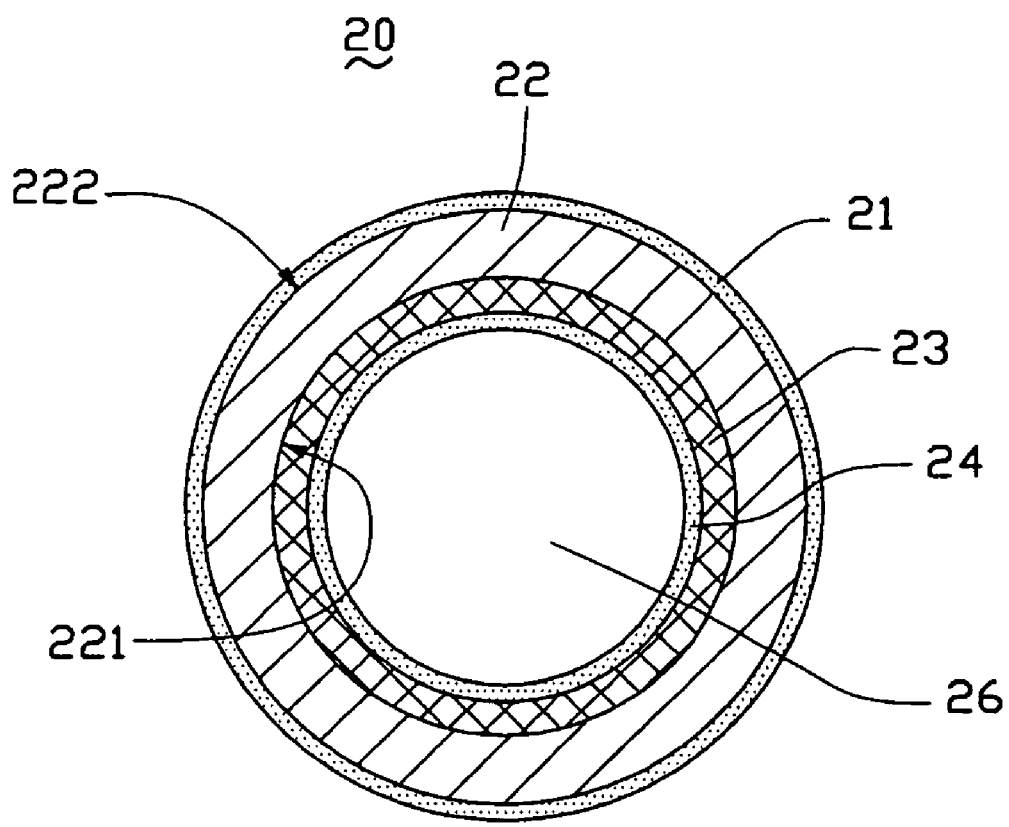
FIG. 3 is a radial cross-sectional view of the heat pipe of FIG. 2.

Referring to FIGS. 2 and 3, the heat pipe 20 includes a protective layer 21, a shell 22, a wick 23, and a hydrophilic layer 24, as arranged from an outside of the heat pipe 20 to an inside thereof. The shell 22, the wick 23, and the hydrophilic layer 24 cooperatively form a chamber 26 in the heat pipe 20. This chamber 26 is configured for containing a certain volume of working fluid 25 therein.

The protective layer 21 of the heat pipe 20 may beneficially be formed of durable, thermally-conductive nanomaterials, such as, for example, carbon nanotubes, nano-sized copper particles, nano-sized aluminum particles, nano-sized particles of a copper-aluminum alloy, and so on. The protective layer 21 has a thickness in the range about from 10 to 500 nanometers. The protective layer 21 preferably has an approximate thickness in the range from 20 to 200 nanometers. The nanomaterials may be formed on an exterior surface of the shell 22 by, e.g., a chemical vapor deposition method, a plasma-enhanced chemical vapor deposition method, or a vacuum sputtering method.

The protective layer 21 is particularly advantageously made of carbon nanotubes, so as to obtain a high conductivity of about 6000 W/m·K and to thereby improve the thermal efficiency of the shell 22. The protective layer 21 is also used for maintaining the degree of vacuum within the heat pipe 20 within a desired range, reducing the opportunity for leaks to occur and improving the stiffness of the heat pipe 20. (As stated above, an increased stiffness/rigidity permits the pipe 20 to withstand a greater degree of vacuum in the interior thereof.) As a result, the stability, working lifetime, and thermal efficiency of the heat pipe 20 are improved. At the same time, the protective layer 21 helps the heat pipe 20 to compactly contact or be positioned at least proximate the heat source 30. In particular, the protective layer 21 can increase a thermal transfer area between the heat pipe 20 and the heat source 30. Further, the protective layer 21 can enhance a mechanical strength of the heat pipe 20.

The shell 22 of the heat pipe 20 is elongated and occupies a substantial portion (roughly 50% or more) of the overall volume of the heat pipe 20. The shell 22 may be made from a material having good heat conductivity and mechanical durability, such as, for example, copper, aluminum, a copper-aluminum alloy, and so on. The shell 22 has a thickness about in the range from 0.1 to 1 micron. The wick 23, as a layer of the heat pipe 20, has an approximate thickness in the range from 0.1 to 0.5 microns. The wick 23 may be made, beneficially, from a porous material such as a mixture of carbon fibers and carbon nano-capsules. Due to the addition of the carbon nanocapsules in the carbon fibers, a contact area of the carbon fibers with the working fluid 25 is increased. Other fiber/nanocapsule material combinations could potentially be considered, so long as such materials would be sufficiently thermally conductive and corrosion resistant. Therefore, the capillarity of wick 23 is enhanced, and the working fluid 25 is driven to flow from the condensation section of the heat pipe 20 back to the evaporation section of the heat pipe 20 more rapidly.

Figure 4:
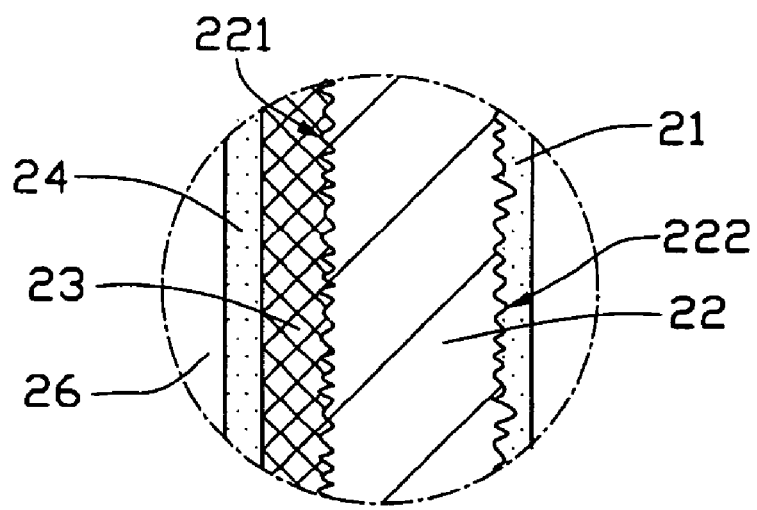
FIG. 4 is an enlarged view of a circled section IV of the heat pipe of FIG. 2.

Referring to FIG. 4, the shell 22 includes an interior surface 221 and an exterior surface 222. The two surfaces 221, 222 have a roughness of peak to valley about in the range from 0.1 to 10 microns, formed, e.g., by using a laser texturing technology. The roughness is preferably in the range about from 0.2 to 1 micron. The pitch of laser texturing is in the approximate range from 1 to 20 microns, and preferably generally in the range from 2 to 5 microns. Thus, the two surfaces 221, 222 have more surface area brought into contact with the wick 23 and the protective layer 21, thereby increasing the heat flow potential from the wick 23 to the shell 22, and then to the protective layer 21. In particular, the wick 23 and the protective layer 21 are readily formed on the shell and are tightly bonded thereto.

Referring back to FIG. 2, the hydrophilic layer 24 of the heat pipe 20 may be formed on the wick 23 by a vacuum coating technique. The hydrophilic layer 24 may be made from nanomaterials such as, for example, nanomaterials of titanium dioxide, zinc oxide, alumina, or any suitable mixtures thereof. The hydrophilic layer 24 has an approximate thickness in the range from 10 to 200 nanometers. The hydrophilic layer 24 is apt to absorb condensed working fluid 25 into the wick 23 of the heat pipe 20 and is therefore beneficial for the working fluid 25 to flow rapidly back to the evaporation section of the heat pipe 20.

In addition, the materials made of the hydrophilic layer 24 are advantageously antibacterial and anti-corrosive. Thus, the hydrophilic layer 24 has a function of cleaning the working fluid 25 and thereby maintaining the properties of the working fluid unchanged over a long period of time. As a result, the working lifetime of the heat pipe 20 is increased.

The working fluid 25 is a liquid at room temperature and pressure and has a relatively low boiling point and stable chemical properties. The working fluid 25 may, advantageously, be selected from the group comprising water, methanol, alcohol, acetone, ammonia, heptane, etc. Preferably, the working fluid 25 has some nano-particles admixed thereinto, for improving heat conductivity thereof. The nano-particles may, e.g., be carbon nanotubes, carbon nanocapsules, nano-sized copper particles, or any suitable mixtures thereof. The nano-particles beneficially occupy about 0.5 to 2 percent by weight in the working fluid 25.

It is to be understood that according to actual need, the heat pipe 20 may have a number of protective layers 21 on the exterior surface of the shell 22. The protective layers 21 may be made from different materials, which have different permeabilities to the same gas. This variance in permeability can help to further reduce the adverse effects caused by permeability of gases, particularly the reduction in the degree of vacuum of the heat pipe 20. Therefore, the stability and working lifetime of the heat pipe 20 are improved.

Alternatively, the heat pipe 20 may be in a form of a plate-type heat pipe or a loop-type heat pipe. Thus, the receiving portion 14 of the substrate 11 may suitably be adapted according to various shapes of end sections of the heat pipes 20. Further, it is recognized that the heat dissipation system 1 may have additional uses beyond electronic/electrical applications and could prove beneficial in any situation where heat dissipation is a concern (e.g., engines, motors).

In operation of the heat dissipation system 1, heat from the heat-generating component 30 firstly is transferred to the substrate 11 of the heat sink via the TIM 40. Then, some heat is dissipated outside through the fins 12, while other heat is conducted to the heat pipe 20. In regard to the heat pipe 20, heat absorbed at the evaporation section evaporates the working fluid 25 contained in the heat pipe 20 into a working gas. Then, the evaporated working fluid 25 (i.e., the working gas) flows to the condensation section and is then condensed into the working liquid 25 by means of the cooling assembly 50. In the illustrated embodiment, the liquid working fluid 25 is advantageously absorbed into the wick 23 under hydrophilic action of the hydrophilic layer 24 and sequentially then due to the capillary action of the wick 23. As a result, the heat dissipation system 1 can efficiently dissipate heat from the heat-generating component 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation system, comprising: a heat sink comprising a substrate and a plurality of fins extending therefrom; a heat pipe having an evaporation section and a condensation section, the evaporation section being coupled to the substrate of the heat sink, the heat pipe comprising: an elongated closed shell defining an inner surface therein; a wick layer formed on the inner surface of the shell; and a working fluid contained in the shell, the wick comprised of a mixture of carbon fibers and carbon nanocapsules; and a cooling assembly with the condensation section of the heat pipe being coupled thereto.

2. The heat dissipation system of claim 1, wherein the heat pipe further comprises at least one protective layer formed on an exterior surface of the shell.

3. The heat dissipation system of claim 2, wherein the protective layer is made from at least one nanomaterial selected from the group consisting of carbon nanotubes, nano-sized copper particles, nano-sized aluminum particles, and nano-sized particles of a copper-aluminum alloy.

4. The heat dissipation system of claim 2, wherein the protective layer has an approximate thickness in the range from 10 to 500 nanometers.

5. The heat dissipation system of claim 1, wherein the wick has an approximate thickness in the range from 0.1 to 0.5 microns.

6. The heat dissipation system of claim 1, wherein the heat pipe further comprises a hydrophilic layer formed on the wick.

7. The heat dissipation system of claim 6, wherein the hydrophilic layer is comprised of at least one nanomaterial selected from the group consisting of nanomaterials of titanium dioxide, zinc oxide, alumina, and any mixtures thereof.

8. The heat dissipation system of claim 6, wherein the hydrophilic layer has a thickness about in the range from 10 to 200 nanometers.

9. The heat dissipation system of claim 1, wherein the shell comprises an interior surface and an exterior surface, the interior surface and the exterior surface each having a roughness of peak to valley in the approximate range from 0.1 to 10 microns.

10. The heat dissipation system of claim 1, wherein the working fluid comprises a volatile liquid and a plurality of thermally conductive nano-particles contained therein.

11. The heat dissipation system of claim 10, wherein the thermally conductive nano-particles are comprised of a material selected from the group consisting of carbon nanotubes, carbon nanocapsules, nano-sized copper particles, and any mixtures thereof.

12. The heat dissipation system of claim 1, further comprising a thermal interface material disposed an underside of the substrate of the heat sink, the underside being opposite a side of the substrate carrying at least a substantial portion of the fins.

13. The heat dissipation system of claim 12, wherein the thermal interface material is comprised of carbon nanotubes.

14. A heat dissipation system comprising: a heat sink comprising a substrate and a plurality of fins extending therefrom; a heat pipe having an evaporation section and a condensation section, the evaporation section being coupled to the substrate of the heat sink, the heat pipe comprising: an elongated closed shell having an inner surface and an outer surface; a wick formed on the inner surface of the shell, the wick comprised of a mixture of carbon fibers and carbon nanocapsules; a protective layer formed on the outer surface of the shell; and a working fluid contained in the shell; and a cooling assembly with the condensation section of the heat pipe being coupled thereto.

15. The heat dissipation system of claim 14, further comprising a hydrophilic layer formed on the wick.

16. The heat dissipation system of claim 14, further comprising a thermal interface material applied on an underside of the substrate, the underside being opposite a side of the substrate carrying at least a substantial portion of the fins.

17. The heat dissipation system of claim 14, wherein the protective layer is comprised of at least one nanomaterial selected from the group consisting of carbon nanotubes, nano-sized copper particles, nano-sized aluminum particles, and nano-sized particles of a copper-aluminum alloy.

* * * * *